(12) United States Patent
Jung et al.

(10) Patent No.: US 8,309,636 B2
(45) Date of Patent: Nov. 13, 2012

(54) FLAME RETARDANT RESIN COMPOSITION FOR MULTILAYER WIRING BOARD AND MULTILAYER WIRING BOARD INCLUDING THE SAME

(75) Inventors: Hyung Mi Jung, Gyunggi-do (KR); Jae Choon Cho, Gyunggi-do (KR); Choon Keun Lee, Gyunggi-do (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 0 days.

(21) Appl. No.: 13/161,760

(22) Filed: Jun. 16, 2011

(65) Prior Publication Data

US 2012/0111618 A1     May 10, 2012

(30) Foreign Application Priority Data

Nov. 5, 2010   (KR) .......................... 10-2010-0109967

(51) Int. Cl.
*C08K 5/5397*   (2006.01)

(52) U.S. Cl. .......................... 524/139; 428/601; 428/901

(58) Field of Classification Search .................. 524/129, 524/139; 428/601, 901
See application file for complete search history.

(56) References Cited

U.S. PATENT DOCUMENTS

| | | | |
|---|---|---|---|
| 6,551,714 B1 * | 4/2003 | Tobisawa | 428/416 |
| 2003/0146421 A1 | 8/2003 | Wakizaka et al. | |
| 2005/0187311 A1 * | 8/2005 | Nakamura | 522/173 |

FOREIGN PATENT DOCUMENTS

| | | |
|---|---|---|
| JP | 06-080598 | 3/1994 |
| JP | 06-145309 | 5/1994 |
| JP | 2001279087 A | 10/2001 |
| JP | 2009-295689 | 12/2009 |
| KR | 100771331 B1 | 10/2007 |

OTHER PUBLICATIONS

Korean Office Action, and English translation thereof, issued in Korean Patent Application No. 10-2010-0109967 dated Jun. 5, 2012.

* cited by examiner

*Primary Examiner* — Peter Szekely
(74) *Attorney, Agent, or Firm* — McDermott Will & Emery LLP

(57) ABSTRACT

There are provided a flame-retardant resin composition for a multilayer wiring board and a multilayer wiring board having the same. The flame-retardant resin composition for a multilayer wiring board according to an exemplary embodiment of the present invention includes a composite epoxy resin including a naphthalene modified epoxy resin, a cresol novolac epoxy resin, a rubber modified epoxy resin and a phosphorous-based epoxy resin, as well as a flame retardant represented by a specific chemical formula. The flame-retardant resin composition for a multilayer wiring board and the multilayer wiring board having the same disclosed herein exhibits excellent flame retardancy, moisture resistance and peel strength.

17 Claims, 1 Drawing Sheet

FLAME RETARDANT RESIN COMPOSITION FOR MULTILAYER WIRING BOARD AND MULTILAYER WIRING BOARD INCLUDING THE SAME

CROSS-REFERENCE TO RELATED APPLICATIONS

This application claims the priority of Korean Patent Application No. 10-2010-0109967 filed on Nov. 5, 2010, in the Korean Intellectual Property Office, the disclosure of which is incorporated herein by reference.

BACKGROUND OF THE INVENTION

1. Field of the Invention

The present invention relates to a flame-retardant resin composition for a multilayer wiring board and a multilayer wiring board having the same and, more particularly, to a flame-retardant resin composition for a multilayer wiring board, having excellent flame retardancy, moisture resistance and exfoliation (or peel) strength, as well as a multilayer wiring board including the same.

2. Description of the Related Art

In general, a printed circuit board (PCB) or a multilayer wiring board refers to a thin board on which electrical components such as an integrated circuit, a resistor, a switch, or the like, are mounted. Such a PCB has been manufactured in various types for use in devices such as electronic equipment, electron communication devices, mobile phones, lap-top computers, or the like, according to use thereof and, in addition, various manufacturing methods have been applied.

With a recent tendency towards a reduction in the size and thickness, and an increase in the density, packaging, or the like, of electronic products, a PCB has also continually been manufactured to have fine pattern and a smaller size, and to be packaged. In order to form a fine pattern, improve reliability and increase a design density of the PCB, raw materials of the PCB are varied and a structure of a circuit in the PCB tends to be changed to have a complex layer configuration.

A typical PCB has been manufactured by using a prepreg PPG, a copper clad laminate (CCL) or a resin-coated copper foil (RCC) and etching the same except for a copper foil portion required to remain as a circuit wiring.

However, as for the fabrication of a PCB having a fine pattern and a small size, the PCB has recently been manufactured by forming micro-circuits through a semi-additive process (SAP) after building up an insulating film. In order to manufacture the PCB according to the foregoing process, an insulating material distinguishable from conventional insulating materials is required. That is, in order to secure drop reliability equal to or higher than that of a copper clad laminate or a resin-coated copper foil, an insulating material having excellent peel strength and superior adhesiveness to a plating layer is required.

SUMMARY OF THE INVENTION

An object of the present invention is to provide a flame-retardant resin composition for a multilayer wiring board, having excellent flame retardancy, moisture resistance and peel strength, and a multilayer wiring board having the same.

According to an aspect of the present invention, there is provided a flame-retardant resin composition for a multilayer wiring board, the flame-retardant resin composition including: a composite epoxy resin including a naphthalene modified epoxy resin, a cresol novolac epoxy resin, a rubber modified epoxy resin and a phosphorous modified epoxy resin; and a flame retardant represented by the following formula:

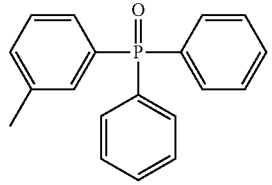

FORMULA

The naphthalene modified epoxy resin may have an average epoxide equivalent weight ranging from 100 to 600, the cresol novolac epoxy resin may have an average epoxide equivalent weight ranging from 300 to 600, the rubber modified epoxy resin may have an average epoxide equivalent weight ranging from 100 to 500, and the phosphorous-based epoxy resin may have an average epoxide equivalent weight ranging from 400 to 800.

The cresol novolac epoxy resin ranging from 1 to 100 parts by weight, the rubber modified epoxy resin ranging from 1 to 100 parts by weight and the phosphorous-based epoxy resin ranging from 1 to 100 parts by weight may be included in relation to 100 parts by weight of the naphthalene modified epoxy resin.

The flame retardant used herein may range from 0.1 to 3 parts by weight in relation to 100 parts by weight of the composite epoxy resin.

The flame-retardant resin composition may further include a curing agent for hardening an epoxy resin ('epoxy curing agent'), which has a softening point ranging from 100 to 140° C. and a hydroxyl equivalent weight of 100 to 150.

The epoxy curing agent may be added in a predetermined amount to allow a ratio of epoxy groups in the composite epoxy resin to hydroxyl groups in the epoxy curing agent to be in a range of 1:0.2 to 1:1.

The flame-retardant resin composition may further include 0.1 to 1 part by weight of a curing promoter in relation to 100 parts by weight of the composite epoxy resin.

The flame-retardant resin composition may further include 10 to 40 parts by weight of an inorganic filler in relation to 100 parts by weight of the composite epoxy resin.

According to another aspect of the present invention, there is provided a multilayer wiring board including: a core substrate on which a first circuit pattern is formed; and an insulating layer provided on at least one of top and bottom faces of the core substrate and containing a flame-retardant resin composition, wherein the flame-retardant resin composition includes: a composite epoxy resin including a naphthalene modified epoxy resin, a cresol novolac epoxy resin, a rubber modified epoxy resin and a phosphorous modified epoxy resin; and a flame retardant represented by the following formula:

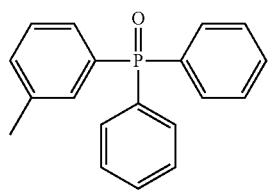

FORMULA

The core substrate may include a flame-retardant resin composition containing: a composite epoxy resin including a naphthalene modified epoxy resin, a cresol novolac epoxy resin, a rubber modified epoxy resin and a phosphorous modified epoxy resin; and a flame retardant represented by the following formula:

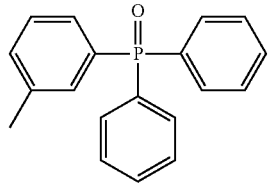

FORMULA

The naphthalene modified epoxy resin may have an average epoxide equivalent weight ranging from 100 to 600, the cresol novolac epoxy resin may have an average epoxide equivalent weight ranging from 300 to 600, the rubber modified epoxy resin may have an average epoxide equivalent weight ranging from 100 to 500, and the phosphorous-based epoxy resin may have an average epoxide equivalent weight ranging from 400 to 800.

The cresol novolac epoxy resin ranging from 1 to 100 parts by weight, the rubber modified epoxy resin ranging from 1 to 100 parts by weight and the phosphorous-based epoxy resin ranging from 1 to 100 parts by weight may be included in relation to 100 parts by weight of the naphthalene modified epoxy resin.

The flame retardant used herein may range from 0.1 to 3 parts by weight in relation to 100 parts by weight of the composite epoxy resin.

The flame-retardant resin composition may further include an epoxy curing agent, which has a softening point ranging from 100 to 140° C. and a hydroxyl equivalent weight of 100 to 150.

The epoxy curing agent may be added in a predetermined amount to allow a ratio of epoxy groups in the composite epoxy resin to hydroxyl groups in the epoxy curing agent to be in a range of 1:0.2 to 1:1.

The flame-retardant resin composition may further include 0.1 to 1 part by weight of a curing promoter in relation to 100 parts by weight of the composite epoxy resin.

The flame-retardant resin composition may further include 10 to 40 parts by weight of an inorganic filler in relation to 100 parts by weight of the composite epoxy resin.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
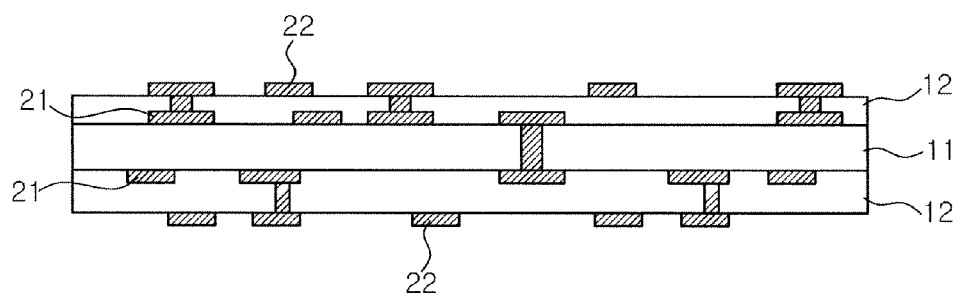
FIG. 1 is a schematic cross-sectional view illustrating a multilayer wiring board according to an exemplary embodiment of the present invention.

Exemplary embodiments of the present invention will be described in detail with reference to the accompanying drawings.

However, the present invention may be embodied in different forms and should not be construed as limited to the embodiments set forth herein. Rather, these embodiments are provided so that this disclosure will be thorough and complete, and will fully convey the scope of the present invention to those skilled in the art to which the present invention pertains.

Therefore, the shapes and/or sizes of respective elements shown in the accompanying drawings may be enlarged for clarity and like reference numerals denote elements substantially having the same configurations or performing similar functions and actions throughout the drawings.

In addition, unless explicitly described to the contrary, the word "comprise" and variations such as "comprises" or "comprising," will be understood to imply the inclusion of stated elements but not the exclusion of any other elements.

FIG. 1 is a schematic cross-sectional view illustrating a multilayer wiring board according to an exemplary embodiment of the present invention. Referring to FIG. 1, a multilayer wiring board according to the exemplary embodiment, includes a core substrate 11 on which a first circuit pattern 21 is formed, and an insulating layer 12 formed on top and bottom faces of the core substrate. The insulating layer 12 may also include a second circuit pattern 22 formed thereon and electrically connected to the first circuit pattern. Although not shown, the insulating layer 12 may be provided on only one of the top and bottom faces of the core substrate.

The insulating layer 12 may contain a flame-retardant resin composition for a multilayer wiring board according to an exemplary embodiment of the present invention. The multilayer wiring board having the flame-retardant resin composition according to the exemplary embodiment of the present invention may exhibit superior flame retardancy, moisture resistance and peel strength, and have excellent thermal stability and mechanical strength.

The following description will be given to concretely explain ingredients constituting the flame-retardant resin composition for a multilayer wiring board according to an exemplary embodiment of the present invention.

The flame-retardant resin composition for a multilayer wiring board according to the exemplary embodiment of the present invention includes: a composite epoxy resin including i) a naphthalene modified epoxy resin, ii) a cresol novolac epoxy resin, iii) a rubber modified epoxy resin, and iv) a phosphorous-based epoxy resin; and a flame retardant represented by the following formula:

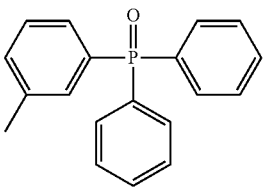

FORMULA

The naphthalene modified epoxy resin i) may have an average epoxide equivalent weight ranging from 100 to 600. If the average epoxide equivalent weight of the naphthalene modified epoxy resin is less than 100, it is difficult to obtain desired physical properties. On the other hand, when the average epoxide equivalent weight exceeds 600, this resin may be rarely dissolved in a solvent and have an increased melting point, to thereby encounter a problem of difficult control.

The epoxy resin normally forms a network structure in a honeycomb shape when it is cured. Since a unit of the network structure has a size considerably greater than a $H_2O$ molecule, moisture may easily penetrate into the network structure. The epoxy resin has —OH groups and —NH groups capable of bonding to water, thus having a structure which is likely to moisture penetration. When moisture penetrates into the hardened epoxy resin, delamination or cracks may occur in the multilayer wiring board.

The epoxy resin generally used in the art may include a bisphenol A type epoxy resin having a relatively high moisture absorption ratio. Therefore, delamination or cracks may occur in the multilayer wiring board.

However, the composite epoxy resin according to the exemplary embodiment of the present invention may contain a naphthalene modified epoxy resin having a relatively low moisture absorption ratio owing to a specific chemical structure, thereby reducing the moisture absorption of the hardened epoxy resin.

The cresol novolac epoxy resin ii) is a novolac type epoxy resin and, if this resin is included, a hardened epoxy resin with high heat resistance may be obtained. Therefore, the thermal stability of the multilayer wiring board may be enhanced.

The cresol novolac epoxy resin may have an average epoxide equivalent weight ranging from 300 to 600.

If the average epoxide equivalent weight of the novolac epoxy resin is less than 300, it is difficult to obtain desired physical properties. On the other hand, when the average epoxide equivalent weight exceeds 600, this resin may be rarely dissolved in a solvent and have an increased melting point, to thereby encounter a problem of difficult control.

A content of the cresol novolac epoxy resin may range from 1 to 100 parts by weight in relation to 100 parts by weight of the naphthalene modified epoxy resin.

If a content of the cresol novolac epoxy resin is less than 1 part by weight, heat resistance may be decreased or electrical or mechanical properties may be deteriorated. On the other hand, the content thereof is more than 100 parts by weight, electrical or mechanical properties may be deteriorated.

The cresol novolac resin may be dissolved in a mixed solvent such as 2-methoxy ethanol, methylethylketone, dimethyl formamide, or the like. Here, the solvent is not particularly limited thereto.

The rubber modified epoxy resin iii) may have an average epoxide equivalent weight ranging from 100 to 500.

If the average epoxide equivalent weight of the rubber modified epoxy resin is less than 100, it is difficult to obtain desired physical properties. On the other hand, when the average epoxide equivalent weight exceeds 500, this resin may be rarely dissolved in a solvent and have an increased melting point, to thereby encounter a problem of difficult control.

A content of the rubber modified epoxy resin may range from 1 to 100 parts by weight, in relation to 100 parts by weight of the naphthalene modified epoxy resin.

If a content of the rubber modified epoxy resin is less than 1 part by weight or more than 100 parts by weight, electrical or mechanical properties may be deteriorated.

Since the phosphorous-based epoxy resin iv) has superior flame retardancy and self-extinguishing properties, the flame retardancy of the multilayer wiring board may be enhanced when the multilayer wiring board includes the phosphorous-based epoxy resin.

The phosphorous-based epoxy resin may have an average epoxide equivalent weight ranging from 400 to 800. If the average epoxide equivalent weight of the phosphorous-based epoxy resin is less than 400, it is difficult to obtain desired physical properties. On the other hand, when the average epoxide equivalent weight exceeds 800, this resin may be rarely dissolved in a solvent and have an increased melting point, to thereby encounter a problem of difficult control.

A content of the phosphorous-based epoxy resin may range from 1 to 100 parts by weight, in relation to 100 parts by weight of the naphthalene modified epoxy resin.

If a content of the rubber modified epoxy resin is less than 1 part by weight, flame retardancy may be decreased. On the other hand, when the content exceeds 100 parts by weight, electrical or mechanical properties may be deteriorated or moisture resistance may be reduced.

The flame-retardant resin composition for a multilayer wiring board according to an exemplary embodiment of the present invention may include a flame retardant represented by the following formula. The flame retardant represented by the formula may be referred to as diphenylcresyl phosphate.

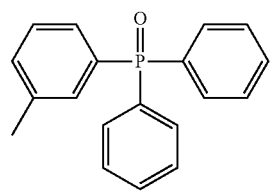

FORMULA

The flame retardant exhibits excellent flame retardancy and is an organic material easily dispersed in the composite epoxy resin. It is expected that the flame retardant is dispersed in a monomer state in the composite epoxy resin.

The flame retardant may be included in an amount of 0.1 to 3 parts by weight, in relation to 100 parts by weight of the composite epoxy resin. The flame retardant may express excellent flame retardancy even in a small content, and also prevent deterioration in the physical properties of the composite epoxy resin.

If a content of the flame retardant is less than 0.1 part by weight, the flame retardancy may be reduced. On the other hand, the content thereof is more than 3 parts by weight, electrical or mechanical properties may be deteriorated.

The flame-retardant resin composition for a multilayer wiring board according to an exemplary embodiment of the present invention may include an epoxy curing agent. By adding the epoxy curing agent to the resin composition, the hardening performance of the composite epoxy resin and the adhesiveness of an insulating layer may be enhanced.

The epoxy curing agent is any one commonly used in the art, without particular limitation.

The epoxy curing agent may be a material that has a softening point ranging from 100 to 140° C. and a hydroxyl equivalent weight of 100 to 150.

The epoxy curing agent is not particularly limited; however, it may be a bisphenol A novolac type curing agent.

The bisphenol A novolac type curing agent having a hydroxyl equivalent weight of 100 to 150 has a relatively high molecular weight, which may elevate the softening point.

The bisphenol A novolac type curing agent has a predetermined number of repeated units of bisphenol structures between two hydroxyl groups and, if the hydroxyl equivalent weight is large, a curing agent for connecting epoxy chains may have an increased molecular weight, thus causing deterioration in the structural compactness of a final cured product.

The epoxy curing agent may be added in an amount to allow a ratio of epoxy groups in the composite epoxy resin to hydroxyl groups in the epoxy curing agent to be in the range of 1:0.2 to 1:1. Within this range, desired physical properties may be easily embodied and the resin composition may show superior reactivity.

In addition, the flame-retardant resin composition for a multilayer circuit board according to an exemplary embodiment of the present invention may include a curing promoter.

The curing promoter may be an imidazole compound, for example, 2-ethyl-4-methyl imidazole, 1-(2-cyanoethyl)-2-alkyl imidazole, 2-phenyl imidazole, or a mixture thereof, without particular limitation thereto.

A content of the curing promoter may range from 0.1 to 1 part by weight, in relation to 100 parts by weight of the composite epoxy resin.

If the content of the curing promoter is less than 0.1 part by weight, a curing speed may be reduced or curing may not be effected. On the other hand, the content thereof is more than 1 part by weight, a curing speed may be too high, causing difficulties in achieving reproducible curing effects.

The flame-retardant resin composition for a multilayer wiring board according to an exemplary embodiment of the present invention may further include inorganic filler. By adding the inorganic filler to the resin composition, the mechanical strength of a cured material containing the epoxy resin may be reinforced.

The inorganic filler is not particularly limited; however, it may be graphite, carbon black, $CaCO_3$, clay, or a mixture thereof. The inorganic filler may also include a filler surface-treated by a silane coupling agent. The inorganic filler may have different sizes or irregular appearance. An average particle diameter of the inorganic filler may range from 2 to 5 μm.

The inorganic filler may be extracted out of the cured material during a desmear process to thereby form a three-dimensional structure. Then, by plating the structure with at least one plating layer to induce mechanical anchoring effects, peel strength may be improved. When the inorganic filler has an irregular outward appearance, improved peel strength may be obtained.

A content of the inorganic filler may range from 10 to 40 parts by weight in relation to 100 parts by weight of the composite epoxy resin. If the content of the inorganic filler is less than 10 parts by weight, it is difficult to enhance the mechanical strength. On the other hand, the content thereof is more than 40 parts by weight, the peel strength may be decreased.

As described above, the flame-retardant resin composition for a multilayer wiring board according to an exemplary embodiment of the present invention may be used as a build-up insulating material for manufacturing a multilayer wiring board.

Figure 2:
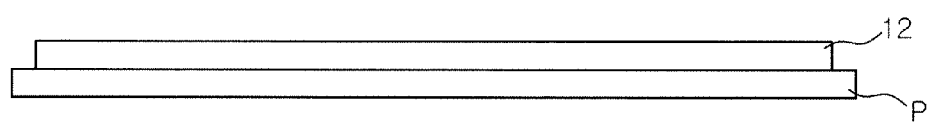
FIG. 2 is a schematic cross-sectional view illustrating an insulating layer containing a flame-retardant resin composition for a multilayer wiring board according an exemplary embodiment of the present invention.

FIG. 2 is a schematic cross-sectional view illustrating an insulating layer containing a flame-retardant resin composition for a multilayer wiring board according an exemplary embodiment of the present invention.

As shown in FIG. 2, the flame-retardant resin composition for a multilayer wiring board according to the exemplary embodiment of the present invention is used to form an insulating layer 12 having a predetermined thickness on a base film P by casting or the like, which may be created by a build-up process. After laminating the insulating layer 12 on a core substrate, a circuit pattern is formed by subjecting the laminated substrate to successive processes such as the formation of via-hole and plating. As a result, the multilayer wiring board as shown in FIG. 1 may be manufactured.

As described above, the insulating layer containing the flame-retardant resin composition for a multilayer wiring board according to an exemplary embodiment of the present invention may have superior flame retardancy and moisture resistance, thereby exhibiting excellent reliability.

In addition, without requiring a compression process, high peel strength may be obtained by only a build-up process and, even after desmear and plating processes, excellent peel strength may be attained. Accordingly, the foregoing insulating layer may be used as an interlayer insulating layer applied to the build-up process for the multilayer wiring board.

The core substrate 11 may be a prepreg (PPG), a copper clad laminate (CCL), a resin coated copper foil (RCC), or the like, which are generally used in the art.

The core substrate 11 may be made of a flame-retardant resin composition for a multilayer wiring board according to an exemplary embodiment of the present invention, such as the insulating layer 12, as described above.

Hereinafter, exemplary embodiments of the present invention will be described with reference to the following examples and comparative examples. However, the present invention is not particularly limited thereto.

EXAMPLE 600 g of naphthalene modified epoxy resin, 700 g of cresol novolac epoxy resin, 200 g of rubber modified epoxy resin, 500 g of phosphorous-based flame-retardant epoxy resin, and 66.7 parts by weight (solvent, 2-methoxyethanol) of bisphenol-A (BPA) novolac type curing agent were added to a mixed solvent including 230 g of methylethylketone (MEK) and 400 g of 2-methoxyethanol, and then, agitated at 300 rpm and at room temperature. After this, 561.42 g of inorganic filler having a size distribution of 2.5 to 3 μm and an irregular morphology was added to the mixture and agitated at 400 rpm for 3 hours. Lastly, after adding 0.5 phr of 2-ethyl-4-methyl imidazole and diphenylcresyl phosphoate (DPK) as a flame retardant to the mixture, agitation was continued for 30 minutes to thereby prepare a flame-retardant resin composition. The prepared flame-retardant resin composition was formed into a roll type product by applying the composition on a PET film through film-casting. The formed product was cut into a size of 405 mm×510 mm, and used to fabricate a multilayer wiring board by a conventional process of manufacturing such a board. Flame retardant properties were measured and the measured results are shown in the following TABLE 1.

COMPARATIVE EXAMPLE

A flame-retardant resin composition was prepared according to the same procedures as the Example, except that a flame retardant was not used or $Mg(OH)_2$ was used as the flame retardant. By using the prepared composition, a multilayer wiring board was fabricated and the flame retardant properties thereof were measured. The measured results are shown in the following TABLE 1.

TABLE 1

| | Post-curing condition | Flame retardant | Test results (after-flame time, second) | | | | | Total | Result |
|---|---|---|---|---|---|---|---|---|---|
| | | | 1 | 2 | 3 | 4 | 5 | | |
| Example | 190° C., 2 hours | DPK, 0.5 phr | 5 | 7.5 | 3 | 6.5 | 6 | 28 | V-0 |
| Com. Ex. 1 | 190° C., 2 hours | — | 9.5 | 14 | 6.5 | 16.5 | 7 | 53.5 | V-1 |
| Com. Ex. 2 | 210° C., 6 minutes | — | 3.5 | 9.5 | 12.5 | 4 | 13 | 42.5 | V-1 |
| Com. Ex. 3 | 100° C., 2 hours | $Mg(OH)_2$, 0.25 phr | 14 | 8.5 | 12.5 | 11.5 | 9.5 | 56 | V-1 |
| Com. Ex. 4 | 100° C., 2 hours | $Mg(OH)_2$, 0.5 phr | 15 | 5.5 | 16.5 | 14 | 9.5 | 60.5 | V-1 |

Referring to TABLE 1, it was found that each multilayer wiring board according to the Example shows an after-flame time of less than 10 seconds, and a total after-flame time of five specimens, that is, the multilayer wiring boards, was less than 50 seconds, under the same post-curing conductions, compared to the Comparative Example. Therefore, the multilayer wiring board in the Example exhibited a flammability rating of V-0 according to UL94 flammability standards. On the contrary, the multilayer wiring board in the Comparative Example met a flammability rating of V-1 according to UL94 flammability standards.

In addition to the foregoing flame retardant properties test, the multilayer wiring board according to the inventive example also exhibited excellent characteristics in various experiments regarding moisture resistance, delamination, resistance features, or the like, compared to the Comparative Example.

An insulating layer containing the flame-retardant resin composition for a multilayer wiring board according to an exemplary embodiment of the present invention may have superior flame retardancy and moisture resistance, thereby exhibiting excellent reliability.

In addition, without requiring a compression process, a peeling strength may be improved by only using the build-up process and, even after a desmear process and a plating process, a high peeling strength may be embodied. Accordingly, the foregoing insulating layer may be used as an interlayer insulating layer applied to the build-up process for a multilayer wiring board.

A multilayer wiring board having the flame-retardant resin composition according to an exemplary embodiment of the present invention may exhibit superior flame retardancy, moisture resistance and peel strength, and have excellent characteristics such as thermal stability and mechanical strength.

While the present invention has been shown and described in connection with the exemplary embodiments, it will be apparent to those skilled in the art that modifications and variations can be made without departing from the spirit and scope of the invention as defined by the appended claims.

What is claimed is:

1. A flame-retardant resin composition for a multilayer wiring board, the flame-retardant resin composition comprising:
    a composite epoxy resin including a naphthalene modified epoxy resin, a cresol novolac epoxy resin, a rubber modified epoxy resin and a phosphorous-based epoxy resin; and
    a flame retardant represented by the following formula

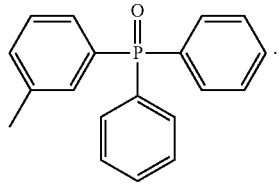

FORMULA

2. The flame-retardant resin composition of claim 1, wherein the naphthalene modified epoxy resin has an average epoxide equivalent weight ranging from 100 to 600,
    the cresol novolac epoxy resin has an average epoxide equivalent weight ranging from 300 to 600,
    the rubber modified epoxy resin has an average epoxide equivalent weight ranging from 100 to 500, and
    the phosphorous-based epoxy resin has an average epoxide equivalent weight ranging from 400 to 800.

3. The flame-retardant resin composition of claim 1, wherein the cresol novolac epoxy resin ranging from 1 to 100 parts by weight, the rubber modified epoxy resin ranging from 1 to 100 parts by weight, and the phosphorous-based epoxy resin ranging from 1 to 100 parts by weight are included in relation to 100 parts by weight of the naphthalene modified epoxy resin.

4. The flame-retardant resin composition of claim 1, wherein the flame retardant ranging from 0.1 to 3 parts by weight is included in relation to 100 parts by weight of the composite epoxy resin.

5. The flame-retardant resin composition of claim 1, further comprising an epoxy curing agent which has a softening temperature ranging from 100 to 140° C. and a hydroxyl equivalent weight of 100 to 150.

6. The flame-retardant resin composition of claim 5, wherein the epoxy curing agent is added in a predetermined amount to allow a ratio of epoxy groups in the composite epoxy resin to hydroxyl groups in the epoxy curing agent to be in a range of 1:0.2 to 1:1.

7. The flame-retardant resin composition of claim 1, further comprising 0.01 to 1 part by weight of a curing promoter in relation to 100 parts by weight of the composite epoxy resin.

8. The flame-retardant resin composition of claim 1, further comprising 10 to 40 parts by weight of an inorganic filler in relation to 100 parts by weight of the composite epoxy resin.

9. A multilayer wiring board comprising:
a core substrate on which a first circuit pattern is formed; and
an insulating layer provided on at least one of top and bottom faces of the core substrate and containing a flame-retardant resin composition,
wherein the flame-retardant resin composition includes:
a composite epoxy resin including a naphthalene modified epoxy resin, a cresol novolac epoxy resin, a rubber modified epoxy resin and a phosphorous modified epoxy resin; and
a flame retardant represented by the following formula

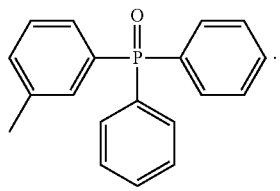

FORMULA

10. The multilayer wiring board of claim 9, wherein the core substrate comprises:
a flame-retardant resin composition including a composite epoxy resin that includes a naphthalene modified epoxy resin, a cresol novolac epoxy resin, a rubber modified epoxy resin and a phosphorous modified epoxy resin; and
a flame retardant represented by the following formula

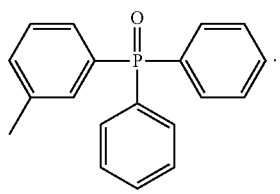

FORMULA

11. The multilayer wiring board of claim 9, wherein the naphthalene modified epoxy resin has an average epoxide equivalent weight ranging from 100 to 600,
the cresol novolac epoxy resin has an average epoxide equivalent weight ranging from 300 to 600,
the rubber modified epoxy resin has an average epoxide equivalent weight ranging from 100 to 500, and
the phosphorous-based epoxy resin has an average epoxide equivalent weight ranging from 400 to 800.

12. The multilayer wiring board of claim 9, wherein the cresol novolac epoxy resin ranging from 1 to 100 parts by weight, the rubber modified epoxy resin ranging from 1 to 100 parts by weight and the phosphorous-based epoxy resin ranging from 1 to 100 parts by weight are included in relation to 100 parts by weight of the naphthalene modified epoxy resin.

13. The multilayer wiring board of claim 9, wherein the flame retardant ranging from 0.1 to 3 parts by weight is included in relation to 100 parts by weight of the composite epoxy resin.

14. The multilayer wiring board of claim 9, wherein the flame-retardant resin composition further includes an epoxy curing agent which has a softening temperature ranging from 100 to 140° C. and a hydroxyl equivalent weight of 100 to 150.

15. The multilayer wiring board of claim 14, wherein the epoxy curing agent is added in a predetermined amount to allow a ratio of epoxy groups in the composite epoxy resin to hydroxyl groups in the epoxy curing agent to be in a range of 1:0.2 to 1:1.

16. The multilayer wiring board of claim 9, further comprising 0.1 to 1 parts by weight of a curing promoter in relation to 100 parts by weight of the composite epoxy resin.

17. The multilayer wiring board of claim 9, further comprising 10 to 40 parts by weight of an inorganic filler in relation to 100 parts by weight of the composite epoxy resin.

* * * * *